(12) United States Patent
Lin

(10) Patent No.: US 9,577,189 B2
(45) Date of Patent: Feb. 21, 2017

(54) METHOD FOR FORMING RRAM CELL INCLUDING V-SHAPED STRUCTURE

(71) Applicant: TAIWAN SEMICONDUCTOR MANUFACTURING CO., LTD., Hsin-Chu (TW)

(72) Inventor: Hsing-Chih Lin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/989,495

(22) Filed: Jan. 6, 2016

(65) Prior Publication Data

US 2016/0118580 A1 Apr. 28, 2016

Related U.S. Application Data

(62) Division of application No. 14/162,024, filed on Jan. 23, 2014, now Pat. No. 9,246,084.

(51) Int. Cl.
*H01L 45/00* (2006.01)
*H01L 51/05* (2006.01)
*H01L 51/00* (2006.01)

(52) U.S. Cl.
CPC ........... *H01L 45/1273* (2013.01); *H01L 45/04* (2013.01); *H01L 45/06* (2013.01); *H01L 45/122* (2013.01); *H01L 45/1233* (2013.01); *H01L 45/14* (2013.01); *H01L 45/142* (2013.01); *H01L 45/143* (2013.01); *H01L 45/144* (2013.01); *H01L 45/146* (2013.01); *H01L 45/147* (2013.01); *H01L 45/16* (2013.01); *H01L 45/1616* (2013.01); *H01L 51/0591* (2013.01); *H01L 51/0035* (2013.01)

(58) Field of Classification Search
CPC ...... H01L 28/20; H01L 28/24; H01L 27/1112; H01L 27/11; H01L 21/32155
USPC ........................................................ 438/385
See application file for complete search history.

(56) References Cited

U.S. PATENT DOCUMENTS

| 8,309,946 | B2 | 11/2012 | Mitani et al. |
| 9,006,698 | B2 * | 4/2015 | Wei .......................... H01L 45/08 257/4 |
| 2013/0234094 | A1 | 9/2013 | Chang et al. |

* cited by examiner

*Primary Examiner* — Quoc Hoang
(74) *Attorney, Agent, or Firm* — Birch, Stewart, Kolasch & Birch, LLP

(57) ABSTRACT

A method of forming an RRAM cell structure is provided. The method includes forming dummy features over a substrate, and the dummy features have a gap therebetween. The method also includes depositing an oxide layer over the dummy features while forming a first V-shaped valley on the oxide layer. The method further includes partially planarizing the oxide layer while leaving the first V-shaped valley. In addition, the method includes forming a first electrode over the oxide layer while forming a second V-shaped valley on the first electrode. The method further includes forming a resistance variable layer over the first electrode in a conformal manner. The method still includes forming a second electrode over the resistance variable layer.

20 Claims, 4 Drawing Sheets

METHOD FOR FORMING RRAM CELL INCLUDING V-SHAPED STRUCTURE

CROSS REFERENCE

This Application is a Divisional application of co-pending U.S. application Ser. No. 14/162,024, filed on Jan. 23, 2014, the entire content of which is hereby incorporated by reference.

BACKGROUND

There is a frequent demand for smaller devices with more memory. Some efforts have been initiated in using a resistance variable as a mechanism for creating more memory is less space. Resistive random access memory (RRAM) is a memory structure including an array of RRAM cells, each of which can change and maintain the value of its resistivity based on applied electrical conditions. Particularly, each of the RRAM cells includes a resistance variable layer, the resistance of which can be adjusted to represent logic "0" or logic "1".

From an application point of view, RRAM has many advantages. RRAM has a simple cell structure and CMOS logic compatible processes which result in a reduction of manufacturing complexity and cost in comparison with non-volatile memory structures. In addition, RRAM can be used in a lower power condition and has a faster timescale than other non-volatile memory structures.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
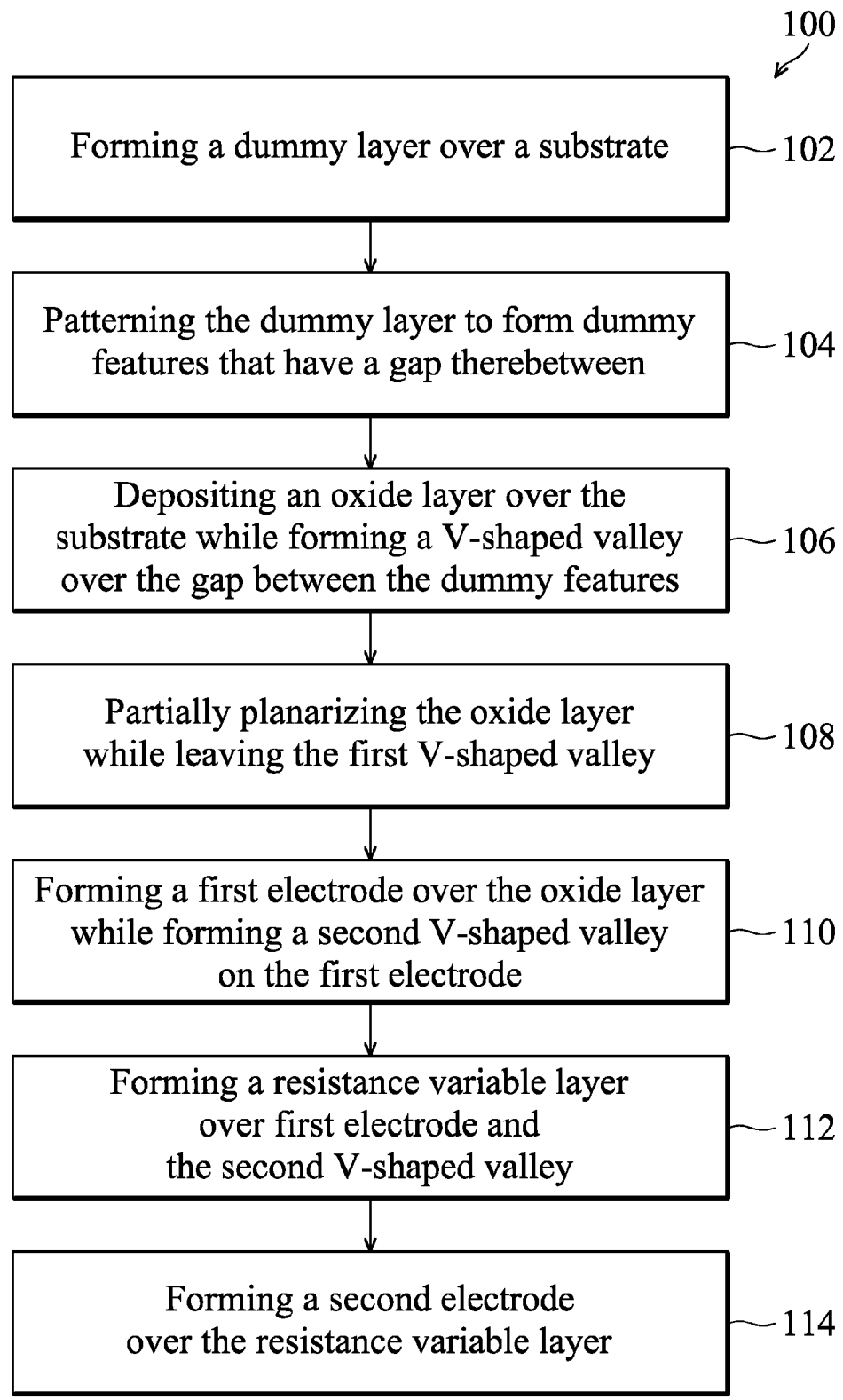
FIG. 1 shows a flow chart of a method for fabricating an RRAM cell structure, in accordance with some embodiments of the disclosure.

FIG. 1 is a flowchart of a method 100 of forming an RRAM cell structure, in accordance with some embodiments of the present disclosure. FIGS. 2A to 2G are cross-sectional views of an RRAM cell structure 200 having a resistance variable memory structure at various stages of manufacture, in accordance with various embodiments of the method of FIG. 1. Additional processes may be provided before, during, or after the method 100 of FIG. 1. Various figures have been simplified for better understanding of the concepts of the present disclosure.

Referring now to FIG. 1, the flowchart of the method 100 begins in operation 102. In operation 102, a dummy layer is formed over a substrate.

Figure 2A:
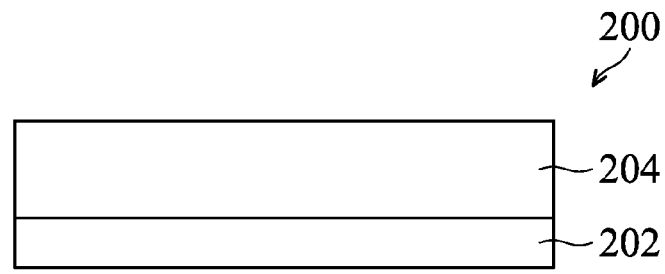
FIGS. 2A to 2G show cross-sectional representations of various stages during the fabrication of an RRAM cell structure in accordance with some embodiments of the disclosure.

Referring to FIG. 2A, which is an enlarged cross-sectional view of a portion of an RRAM cell structure 200 after performing operation 102, in accordance with some embodiments. A dummy layer 204 is formed on a semiconductor substrate 202. In some embodiments, the substrate 202 includes a semiconductor substrate such as a silicon substrate. Alternatively, the substrate 202 includes a substrate such as GaAs, InP, SiGe or SiC substrate. In some embodiments, the substrate 202 includes a plurality of device structures formed within the substrate 202. Examples of the device structures include transistors, resistors, and/or capacitors.

In some embodiments, a dummy layer 204 includes silicon oxide, silicon nitride, silicon oxynitride, a combination thereof or other suitable insulating materials. The dummy layer 204 is formed by chemical vapor deposition (CVD), atomic layer deposition (ALD), or spinning on glass (SOG). In some embodiments, the dummy layer 204 has a thickness ranging from about 500 A to about 10000 A.

Referring back to FIG. 1, method 100 continues to operation 104. In operation 104, the dummy layer is patterned to form dummy features that have a gap therebetween.

Figure 2B:
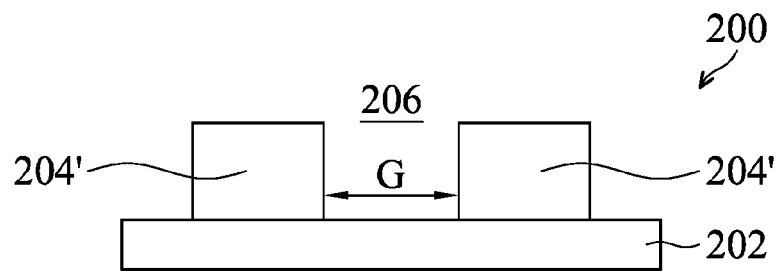

Referring to FIG. 2B, which is an enlarged view of the RRAM cell structure 200 after performing operation 104, in accordance with some embodiments. The dummy layer 204 is patterned to dummy features 204' that have a gap G therebetween, where an opening 206 is also formed. In some embodiments, the gap G between the dummy features 204' is in a range from about 5 nm to about 1500 nm. The opening 206 between the dummy features 204' has an aspect ratio ranging from about 0.1 to about 30. The dummy layer 204 is patterned by photolithography processing and etching. The photolithography processing may include photoresist coating, soft baking, mask aligning, exposing pattern, post-exposure baking, developing photoresist, hard baking and stripping after the etching. The photolithography patterning may also be achieved by other suitable methods such as maskless photolithography, electron-beam writing, ion-beam writing, optical writing or molecular imprint. In some embodiments, the etching includes a wet etch or dry etch.

Referring back to FIG. 1, method 100 continues to operation 106. In operation 106, an oxide layer is deposited over the substrate while forming a V-shaped valley over the gap between the dummy features.

Figure 2C:
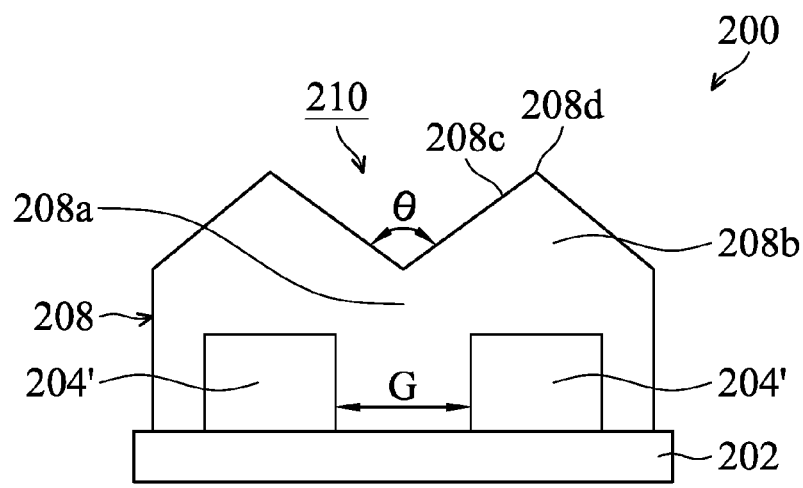

Referring to FIG. 2C, which is an enlarged view of the RRAM cell structure 200 after performing operation 106, in accordance with some embodiments. An oxide layer 208 is deposited over the substrate 202. The oxide layer 208 covers the dummy features 204' and fully or partially fills the opening 206. In some embodiments, the oxide layer 208 includes a first portion 208a over the gap G and a second portion 208b over the dummy features 204'. As shown in FIG. 2C, due to the opening 206, a recession such as a first V-shaped valley 210 is formed on the first portion 208a of the oxide layer 208 (i.e., forming a V-shaped upper surface 208c of the first portion 208a). In some embodiments, the first V-shaped valley 210 has an included angle θ ranging from about 10 degrees to about 170 degrees. The second portion 208b of the oxide layer 208 extends from the first portion 208a and has tips 208d oriented towards to a direction away from the substrate 202. In some embodiments, the oxide layer 208 is made of the high-density plasma oxide. Experiments show that the profile of the oxide layer 208, including the first V-shaped valley 210 of the first portion 208a and tips 208d of the second portion 208b, is as result of the high density of the high-density plasma film. In some embodiments, the oxide layer 208 has a thickness ranging from 50 A to 10000 A.

In some embodiments, the high-density plasma oxide is formed by high-density plasma chemical vapor deposition (HDPCVD), which includes simultaneous deposition and sputtering components. The HDPCVD includes deposition reaction gas such as $SiH_4$, $O_2$ and an auxiliary gas such as Ar, He or $H_2$ to achieve the deposition of the oxide layer at the same time and etching. In some embodiments, the deposition-to-sputter (D:S) ratio is in a range from about 1 to about 20.

Referring back to FIG. 1, method 100 continues with operation 108. In operation 108, the oxide layer is partially planarized while leaving the first V-shaped valley.

Figure 2D:
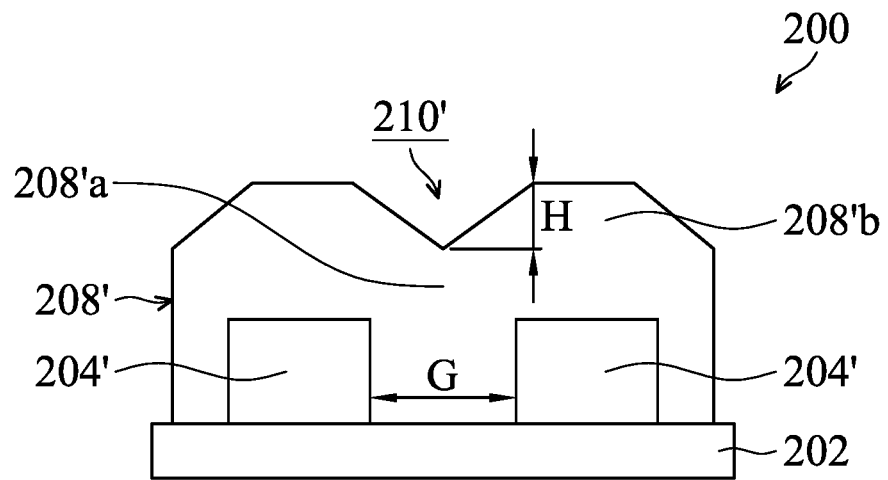

Refer to FIG. 2D, which is an enlarged view of the RRAM cell structure 200 after performing operation 108, in accordance with some embodiments. The oxide layer 208 is partially planarized to planarize the second portion 208b of oxide layer 208 over dummy features 204'. The first V-shaped valley 210' on the first portion 208a of the oxide layer 208 remains with a reduced height. In some embodiments, the planarization is performed by a chemical mechanical polish (CMP) process. A height H from bottom to top of the first V-shaped valley 210', such as in a range from about 50 A to about 10000 A, may be controlled by the CMP process.

Referring back to FIG. 1, method 100 continues with operation 110. In operation 110, a first electrode is formed over the oxide layer while forming a second V-shaped valley on the first electrode.

Figure 2E:
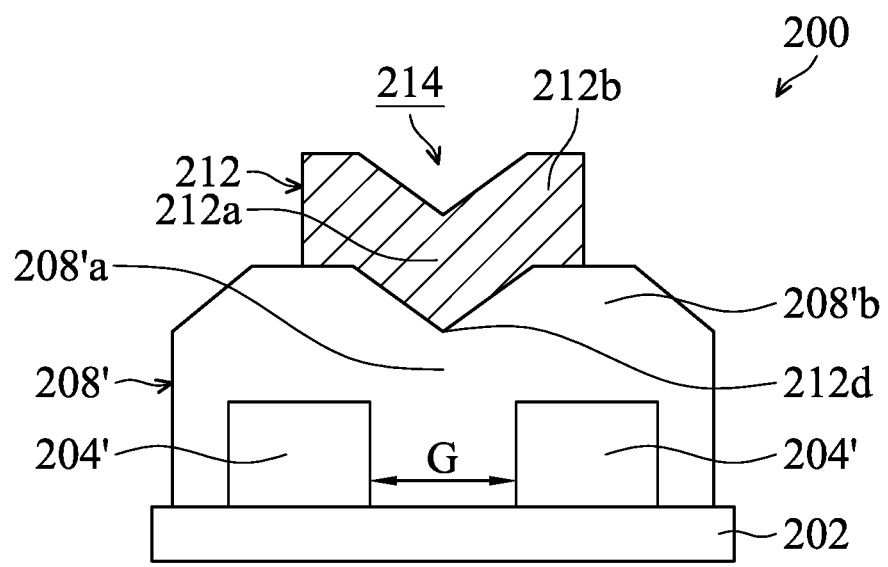

Refer to FIG. 2E, which is an enlarged view of the RRAM cell structure 200 after performing operation 106, in accordance with some embodiments. A first electrode 212 is formed over the planarized oxide layer 208'. In some embodiments, the first electrode 212 has a shape conformal to the planarized oxide layer 208' and has a portion partially filling the first V-shaped valley 210'. For example, the first electrode 212 includes a first portion 212a that is over the gap G (and over the first V-shaped valley 210') and in a V-shape. The first electrode 212 also includes a second portion 212b that is over the second portion 208'b of the oxide layer 208' and in a planar shape. The second portion 212b extends from the first portion 212a. The first portion 212b of the first electrode 212 has a tip 212d at the bottom of the V-shape oriented towards to the substrate 202. A second V-shaped valley 214 is formed on the first portion 212a of the first electrode 212. In some embodiments, the first electrode 212 has a thickness ranging from about 50 A to about 30000 A.

In some embodiments, the first electrode 212 includes multi-layers (not shown), such as a bottom barrier layer, a main metal layer and a top barrier layer. The bottom barrier layer, the main metal layer and the top barrier layer each has a V-shaped portion and a planar portion. The bottom and top barrier layers each may include Ti, TiN, Ta, or TaN. The main metal layer may include copper (Cu), aluminum (Al), tungsten (W) or their alloys, such as AlCu. The bottom and top barrier layers are capable of being used as anti-oxidation layers to protect the main metal layer from being oxidized. In addition, the bottom and top barrier layers are also capable of being used as adhesion layers to improve the adhesion between the main metal layer and insulating materials.

The first electrode 212 may be formed by a procedure including depositing, photolithography, and etching processes. The deposition processes include chemical vapor deposition (CVD), physical vapor deposition (PVD), atomic layer deposition (ALD), or applicable methods. The photolithography processes may include photoresist coating (e.g., spin-on coating), soft baking, mask aligning, exposure, post-exposure baking, developing the photoresist, rinsing, and drying (e.g., hard baking). In some embodiments, the etching processes includes dry etching, wet etching, and/or other etching methods.

Referring back to FIG. 1, method 100 continues with operation 112. In operation 112, a resistance variable layer is formed over the first electrode and the second V-shaped valley.

Figure 2F:
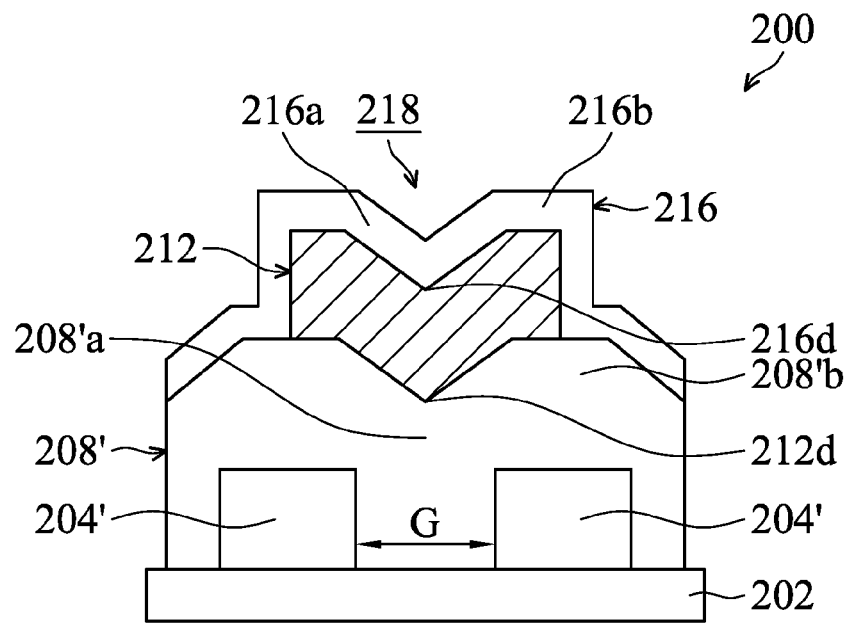

Refer to FIG. 2F, which is an enlarged view of the RRAM cell structure 200 after performing operation 112, in accordance with some embodiments. A resistance variable layer 216 is deposited over the substrate 202 and covers the first electrode 212 and the second V-shaped valley 214. The resistance variable layer 216 has a resistivity capable of switching between a high resistance state and a low resistance state (or conductive), by application of an electrical voltage. In some embodiments, the resistance variable layer 216 has a substantially uniform thickness. In some embodiments, the resistance variable layer 216 has a shape conformal to the first electrode 212 and has a portion partially filling the second V-shaped valley 214. In For example, the resistance variable layer 216 includes a first portion 216a that is over the gap G (and over the second V-shaped valley 214) and in a V-shape. The resistance variable layer 216 also includes a second portion 216b that is over the second portion 212b of the first electrode 212 and in a planar shape. In some embodiments, the resistance variable layer 216 further includes a portion covering the sidewalls of the first electrode layer 212 and the oxide layer 208'. The second portion 216b extends from the first portion 216a. In some embodiments, the first portion 216a of the resistance variable layer 216 has a tip 216d that is at the bottom of the V-shape and aligned to the tip 212d of the first electrode 212. A third V-shaped valley 218 is formed on the first portion 216a of the resistance variable layer 216. In some embodiments, the resistance variable layer 216 has a thickness ranging from about 20 A to about 5000 A.

In some embodiments, the resistance variable layer 216 includes one or more dielectric materials including a high-k material, a binary metal oxide, a transitional metal oxide, chalcogenides, carbon polymers and/or perovskites. In some embodiments, the resistance variable layer 216 includes titanium oxide, nickel oxide, hafnium oxide, zirconium oxide, tungsten oxide, zinc oxide, aluminum oxide, tantalum oxide, molybdenum oxide or copper oxide. Alternatively the resistance variable layer 216 includes $Ge_2Sb_2Te_5$, AgInSbTe, $SrTiO_3$, $ZrTiO_3$, $Pr_{0.7}Ca_{0.3}MnO_3$ (PCMO), GeS, GeSe, $Cu_2S$, copper 7,7,8,8-tetracyanoquinodimethane (CuTCNQ) or a combination thereof. Example formation methods of the resistance variable layer 216 include pulse laser deposition (PLD), ALD or CVD. In some embodiments, patterning processes are applied to the resistance variable layer 216.

Referring back to FIG. 1, method 100 continues with operation 114. In operation 114, a second electrode is formed over the resistance variable layer.

Figure 2G:
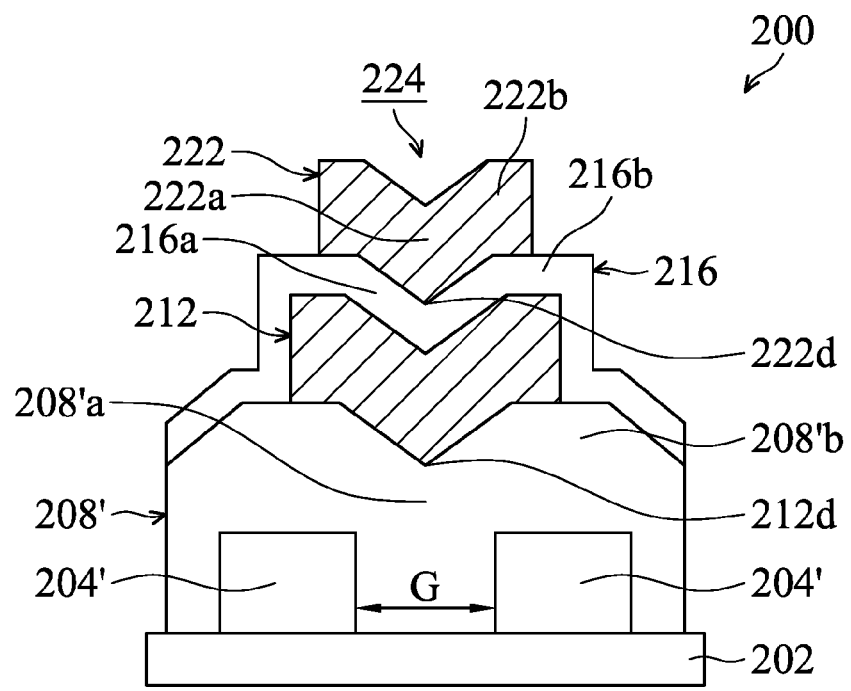

Refer to FIG. 2G, which is an enlarged view of the RRAM cell structure 200 after performing operation 114, in accordance with some embodiments. A second electrode 222 is deposited over the resistance variable layer 216. For example, the second electrode 222 has a shape conformal to the first electrode 212 and partially fills in the third V-shaped valley 218. The second electrode 222 includes a first portion 222a that is over the gap G (and over the third V-shaped valley 218) and in a V-shape. The second electrode 222 also includes a second portion 222b that is over the second portion 216b of resistance variable layer 216 and in a planar shape. The second portion 222b extends from the first portion 222a. In some embodiments, the first portion 222a of the second electrode 222 has a tip 222d at the bottom of the V-shape and is aligned to the tips 212d and 216d. A fourth V-shaped valley 224 is formed on the first portion 216a of the second electrode 222. In some embodiments, the bottom of the fourth V-shaped valley 224 is oriented towards to the substrate 202 and is aligned to the tips 212d, 216d and 222d. In some embodiments, the second electrode 222 has a thickness ranging from about 50 A to about 30000 A.

In some embodiments, the second electrode 222 includes multi-layers (not shown), such as a bottom barrier layer, a main metal layer and a top barrier layer. The bottom barrier layer, the main metal layer and the top barrier layer each has a V-shaped portion and a planar portion. The bottom and top barrier layers each may include Ti, TiN, Ta, or TaN. The main metal layer may include copper (Cu), aluminum (Al), tungsten (W) or their alloys, such as AlCu. The bottom and top barrier layers are capable of being used as anti-oxidation layer to protect the main metal layer from being oxidized. In addition, the bottom and top barrier layers are also capable of being as an adhesion layer to improve the adhesion between the main metal layer and insulating materials.

The second electrode 222 may be formed by a procedure including depositing, photolithography, and etching processes. The deposition processes include chemical vapor deposition (CVD), physical vapor deposition (PVD), atomic layer deposition (ALD), or applicable methods. The photolithography processes include photoresist coating (e.g., spin-on coating), soft baking, mask aligning, exposure, post-exposure baking, developing the photoresist, rinsing, and drying (e.g., hard baking). The etching processes include dry etching, wet etching, and/or other etching methods.

The RRAM cell structure 200 is formed. Each of the resistance variable layer 216 and the electrodes 212 and 222 includes a V-shaped structure. An electric field in the RRAM cell structure 200 would be enhanced by the sharp tips 212d, 216d and 222d of the V-shaped structures. Accordingly, a lower voltage and faster soft breakdown can be achieved. The RRAM cell structure 200, having the V-shaped structures, needs a lower voltage and has a faster read/write operating time, when compared to traditional RRAM having a plate stack structure. In addition, the formation method of the RRAM cell structure 200 is easy and compatible with the normal fabrication process of CMOS devices.

According to some embodiments, an RRAM cell structure is provided. The RRAM cell structure includes a resistance variable layer sandwiched between electrodes, and each of the resistance variable layer and the electrodes includes a V-shaped portion. According to this design, the RRAM cell structure needs only a low voltage and has a fast read/write operating time. The RRAM cell structure of the present disclosure therefore can have improved performance and meet the requirements of advanced memory devices.

According to some embodiments, an RRAM cell structure is provided. The RRAM cell structure includes a first electrode over a substrate. The RRAM cell structure also includes a resistance variable layer over the first electrode. The resistance variable layer has a first portion in a V-shape. The RRAM cell structure further includes a second electrode over the resistance variable layer.

According to some embodiments, an RRAM cell structure is provided. The RRAM cell structure includes dummy features having a gap therebetween over a substrate. The RRAM cell structure also includes an oxide layer over the dummy features. The oxide layer has a first portion that is over the gap and has a V-shaped upper surface and a second portion that is over the dummy features has a planar upper surface. The RRAM cell structure further includes a first electrode over the oxide layer in a conformal manner. In addition, the RRAM cell structure includes a resistance variable layer over the first electrode in a conformal manner. The RRAM cell structure also includes a second electrode over the resistance variable layer.

According to some embodiments, a method of forming an RRAM cell structure is provided. The method includes forming dummy features over a substrate, and the dummy features have a gap therebetween. The method also includes depositing an oxide layer over the dummy features while forming a first V-shaped valley on the oxide layer. The method further includes partially planarizing the oxide layer while leaving the first V-shaped valley. In addition, the method includes forming a first electrode over the oxide layer while forming a second V-shaped valley on the first electrode. The method further includes forming a resistance variable layer over the first electrode in a conformal manner. The method still includes forming a second electrode over the resistance variable layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an RRAM cell structure, comprising:
   forming dummy features over a substrate, wherein the dummy features have a gap therebetween;
   depositing an oxide layer over the dummy features while forming a first V-shaped valley on the oxide layer;
   partially planarizing the oxide layer while leaving the first V-shaped valley;
   forming a first electrode over the oxide layer while forming a second V-shaped valley on the first electrode;
   forming a resistance variable layer over the first electrode in a conformal manner; and
   forming a second electrode over the resistance variable layer.

2. The method as claimed in claim 1, wherein the oxide layer is formed by high-density plasma CVD.

3. The method as claimed in claim 2, wherein the deposition-sputter-ratio of the high-density plasma CVD is in a range from about 1 to about 20.

4. The method as claimed in claim 1, wherein forming the resistance variable layer comprises forming a third V-shaped valley on the resistance variable layer.

5. The method as claimed in claim 1, wherein depositing an oxide layer over the dummy features further comprises forming tips of the oxide layer over the dummy features.

6. The method as claimed in claim 5, wherein partially planarizing the oxide layer comprises removing the tips of the oxide layer.

7. The method as claimed in claim 1, wherein forming the second electrode layer comprises forming a fourth V-shaped valley on the second electrode layer.

8. A method of forming an RRAM cell structure, comprising:
   forming an insulating layer over a substrate such that a first V-shaped valley is formed on the insulating layer;
   partially removing the insulating layer while leaving the first V-shaped valley;
   forming a first electrode over the insulating layer while forming a second V-shaped valley on the first electrode;
   forming a resistance variable layer over the first electrode; and
   forming a second electrode over the resistance variable layer.

9. The method as claimed in claim 8, wherein the partially removal of the insulating layer forms a planar upper surface of the insulating layer.

10. The method as claimed in claim 8, wherein the resistance variable layer is conformally formed over the first electrode such that a third V-shaped valley is formed on the resistance variable layer.

11. The method as claimed in claim 8, wherein the second electrode is conformally formed over the resistance variable layer such that a fourth V-shaped valley is formed on the second electrode.

12. The method as claimed in claim 8, wherein a portion of the resistance variable layer is formed in the second V-shaped valley.

13. The method as claimed in claim 8, wherein the insulating layer is formed by high-density plasma CVD.

14. The method as claimed in claim 8, wherein the resistance variable layer is directly formed on the first electrode.

15. The method as claimed in claim 8, wherein the partially removal of the insulating layer comprises removing a tip of the insulating layer.

16. A method of forming an RRAM cell structure, comprising:
   forming a lower electrode having a first sharp tip over a substrate;
   forming a resistance variable layer over the lower electrode such that a second sharp tip of the resistance variable layer and the first sharp tip are substantially aligned with each other and face towards a same direction that is toward the substrate; and
   forming an upper electrode over the resistance variable layer.

17. The method as claimed in claim 16, wherein the upper electrode is conformally formed over the resistance variable layer such that a third sharp tip of the upper electrode is substantially aligned with the second sharp tip and faces towards the same direction.

18. The method as claimed in claim 16, further comprising:
   forming two features over the substrate before the formation of the lower electrode; and
   forming an insulating layer over the two features such that a valley is formed on the insulating layer before the formation of the lower electrode, wherein a portion of the lower electrode is formed in the valley.

19. The method as claimed in claim 18, further comprising partially removing the insulating layer to remove a sharp tip of the insulating layer such that a planar upper portion of the insulating layer is formed before the formation of the lower electrode.

20. The method as claimed in claim 19, wherein the lower electrode is conformally formed over the insulating layer such that a portion of the planar upper portion of the insulating layer is covered by the lower electrode.

* * * * *